US008661398B1

(12) United States Patent
Moroz et al.

(10) Patent No.: US 8,661,398 B1
(45) Date of Patent: *Feb. 25, 2014

(54) ANALYSIS OF STRESS IMPACT ON TRANSISTOR PERFORMANCE

(71) Applicants: Victor Moroz, Saratoga, CA (US); Dipankar Pramanik, Saratoga, CA (US)

(72) Inventors: Victor Moroz, Saratoga, CA (US); Dipankar Pramanik, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 13/852,963

(22) Filed: Mar. 28, 2013

Related U.S. Application Data

(60) Continuation of application No. 12/510,187, filed on Jul. 27, 2009, now Pat. No. 8,413,096, which is a division of application No. 11/291,294, filed on Dec. 1, 2005, now Pat. No. 8,407,634.

(51) Int. Cl.
*G06F 17/50* (2006.01)

(52) U.S. Cl.
USPC .............. 716/136; 716/111; 716/115; 703/2; 703/14

(58) Field of Classification Search
None
See application file for complete search history.

(56) References Cited

U.S. PATENT DOCUMENTS

| | | | |
|---|---|---|---|
| 5,600,578 A | 2/1997 | Fang et al. |
| 5,606,518 A | 2/1997 | Fang et al. |
| 6,420,231 B1 | 7/2002 | Harari et al. |
| 6,599,781 B1 | 7/2003 | Li |
| 6,831,292 B2 | 12/2004 | Currie et al. |
| 6,881,632 B2 | 4/2005 | Fitzgerald et al. |
| 7,032,194 B1 | 4/2006 | Hsueh et al. |
| 7,219,045 B1 | 5/2007 | Wu et al. |
| 7,266,787 B2 | 9/2007 | Hughes et al. |
| 7,291,519 B2 | 11/2007 | Bhattacharyya |
| 7,307,273 B2 | 12/2007 | Currie |
| 7,337,420 B2 | 2/2008 | Chidambarrao et al. |
| 7,437,260 B2 | 10/2008 | Ausserlechner et al. |
| 7,440,861 B2 | 10/2008 | Ausserlechner et al. |
| 7,480,604 B2 | 1/2009 | Bianchi |
| 7,484,198 B2 | 1/2009 | Lin et al. |

(Continued)

OTHER PUBLICATIONS

Chidambaram et al., "35% Drive Current Improvement from Recessed-SiGe Drain Extensions on 37 nm Gate Length PMOS," 2004 Symposium on VLSI Technology Digest of Technical Papers, pp. 48-49.*

(Continued)

*Primary Examiner* — Leigh Garbowski
(74) *Attorney, Agent, or Firm* — Haynes Beffel & Wolfeld LLP; Warren S. Wolfeld

(57) ABSTRACT

Roughly described, a method for approximating stress-induced mobility enhancement in a channel region in an integrated circuit layout, including approximating the stress at each of a plurality of sample points in the channel, converting the stress approximation at each of the sample points to a respective mobility enhancement value, and averaging the mobility enhancement values at all the sample points. The method enables integrated circuit stress analysis that takes into account stresses contributed by multiple stress generation mechanisms, stresses having vector components other than along the length of the channel, and stress contributions (including mitigations) due to the presence of other structures in the neighborhood of the channel region under study, other than the nearest STI interfaces. The method also enables stress analysis of large layout regions and even full-chip layouts, without incurring the computation costs of a full TCAD simulation.

21 Claims, 6 Drawing Sheets

(56) References Cited

U.S. PATENT DOCUMENTS

| | | | |
|---|---|---|---|
| 7,542,891 | B2 | 6/2009 | Lin et al. |
| 7,567,891 | B1 | 7/2009 | Liu et al. |
| 7,921,401 | B2 | 4/2011 | Ito et al. |
| 8,086,990 | B2 | 12/2011 | Lin et al. |
| 2003/0173588 | A1 | 9/2003 | Bianchi |
| 2004/0044511 | A1 | 3/2004 | Sekido et al. |
| 2004/0059559 | A1 | 3/2004 | Shimizu et al. |
| 2004/0075149 | A1 | 4/2004 | Fitzgerald et al. |
| 2004/0153986 | A1 | 8/2004 | Sahara et al. |
| 2005/0017304 | A1 | 1/2005 | Matsushita et al. |
| 2005/0040460 | A1 | 2/2005 | Chidambarrao et al. |
| 2005/0077511 | A1 | 4/2005 | Fitzergald |
| 2005/0093059 | A1 | 5/2005 | Belyansky et al. |
| 2005/0104057 | A1 | 5/2005 | Shaheed et al. |
| 2005/0110039 | A1 | 5/2005 | Chi et al. |
| 2005/0112822 | A1 | 5/2005 | Litwin |
| 2005/0121727 | A1 | 6/2005 | Ishitsuka et al. |
| 2005/0139929 | A1 | 6/2005 | Rost |
| 2005/0158931 | A1 | 7/2005 | Chen et al. |
| 2005/0176204 | A1 | 8/2005 | Langdo et al. |
| 2005/0184345 | A1 | 8/2005 | Lin et al. |
| 2005/0247926 | A1 | 11/2005 | Sun et al. |
| 2006/0003510 | A1 | 1/2006 | Kammler et al. |
| 2006/0019458 | A1 | 1/2006 | Chidambarrao et al. |
| 2006/0043529 | A1 | 3/2006 | Chidambarrao et al. |
| 2006/0091475 | A1 | 5/2006 | Fujii et al. |
| 2006/0142987 | A1 | 6/2006 | Ishizu et al. |
| 2006/0186478 | A1 | 8/2006 | Hughes et al. |
| 2006/0190893 | A1 | 8/2006 | Morton |
| 2006/0228863 | A1 | 10/2006 | Zhang et al. |
| 2006/0240650 | A1 | 10/2006 | Orlowski et al. |
| 2006/0267130 | A1 | 11/2006 | Rao |
| 2007/0026599 | A1 | 2/2007 | Peidous et al. |
| 2007/0028195 | A1 | 2/2007 | Chidambarrao et al. |
| 2007/0096170 | A1 | 5/2007 | Chidambarrao et al. |
| 2007/0096206 | A1 | 5/2007 | Chidambarrao |
| 2007/0108531 | A1 | 5/2007 | Chidambarrao |
| 2007/0202652 | A1 | 8/2007 | Moroz et al. |
| 2008/0127005 | A1 | 5/2008 | Lin et al. |
| 2008/0195983 | A1 | 8/2008 | Chidambarrao et al. |
| 2009/0057777 | A1 | 3/2009 | Fujii et al. |
| 2009/0095987 | A1 | 4/2009 | Rost |
| 2009/0113368 | A1 | 4/2009 | Lin et al. |
| 2009/0217217 | A1 | 8/2009 | Lin et al. |

OTHER PUBLICATIONS

Ghani et al., "A 90nm High Volume Manufacturing Logic Technology Featuring Novel 45 nm Gate Length Strained Silicon CMOS Transistors," 2003 IEEE, pp. 978-980.*

Moroz et al., "The Impact of Layout on Stress-Enhanced Transistor Performance," Int'l Conference on Simulation of Semiconductor Processes and Devices, SISPAD 2005, pp. 143-146.*

Moroz et al., "Modeling the impact of stress on silicon processes and devices," Materials Science in Semiconductor Processing, 2003, pp. 27-36.*

Nouri et al., "A Systematic Study of Trade-offs in Engineering a Locally Strained pMOSFET," 2004, IEEE, pp. 1055-1058.*

R.A. Bianchi et al., "Accurate Modeling of Trench Isolation Induced Mechanical Stress Effects on MOSFET Electrical Performance," IEEE IEDM Tech. Digest, pp. 117-120 (Dec. 2002).

Xuemei (Jane) Xi, et al., "BSIM4.3.0 Model, Enhancements and Improvements Relative to BSIM4.2.1", University of California at Berkeley (2003) available at http://www-devices.eecs.berkeley.edu/~bsim3/BSIM4/BSIM430/doc/BSIM430_Enhancement.pdf.

F. Nouri et al., "A Systematic Study of Trade-offs in Engineering a Locally Strained pMOSFET", Proc. IEDM, pp. 1055-1058, 2004.

S.E. Thompson et al., "A 90-nm Logic Technology Featuring Strained-Silicon", IEEE Transactions on Electron Devices, 2004.

G. Eneman et al, "Layout Impact on the Performance of a Locally Strained PMOSFET", 2005 Symposium on VLSI Technology Digest of Technical Papers, pp. 22-23, 2005.

V. Moroz et al., "Analyzing strained-silicon options for stress-engineering transistors", Solid State Technology, Jul. 2004.

Y. Kanda, "A Graphical Representation of the Piezoresistance Coefficients in Silicon", IEEE Transactions on Electron Devices, vol. ED-29, No. 1, Jan. 1982.

C.S. Smith, "Piezoresistance Effect in Germanium and Silicon", Physical Review, vol. 94, No. 1, Apr. 1, 1954.

Smith, et al., "Exploring the Limits of Stress-Enhanced Hole Mobility", IEEE Electron Device Letters, vol. 26, No. 9, Sep. 2005.

Moroz, et al., "Options at the 45 nm node include engineered substrates", Solid State Technology, Jul. 2005.

Gildenblat, G., et al., "PSP Model" Department of Electrical Engineering, The Pennsylvania State University and Philips Research, (Aug. 2005) 82 pages.

First Office Action, mailed Feb. 3, 2010 in U.S. Appl. No. 11/291,294.

First Office Action, mailed Mar. 18, 2010 in U.S. Appl. No. 12/510,187.

Response filed Jul. 29, 2010 to Office Action mailed Feb. 3, 2010 in U.S. Appl. No. 11/291,294.

Response filed Aug. 13, 2010 to Office Action mailed Mar. 18, 2010 in U.S. Appl. No. 12/510,187.

First Office Action mailed Sep. 15, 2010 in U.S. Appl. No. 12/510,182.

Office action mailed Oct. 14, 2010 in U.S. Appl. No. 11/291,294.

Response C filed Dec. 15, 2010 to Office action mailed Oct. 14, 2010 in U.S. Appl. No. 11/291,294.

Response A filed Dec. 15, 2010 to First Office Action mailed Sep. 15, 2010 in U.S. Appl. No. 12/510,182.

Final Office Action mailed Nov. 10, 2010 in U.S. Appl. No. 12/510,187.

Response B filed Dec. 15, 2010 to Final Office Action mailed Nov. 10, 2010 in U.S. Appl. No. 12/510,187.

Final Office Action mailed Mar. 2, 2011 in U.S. Appl. No. 11/291,294.

Office Action mailed May 20, 2011 in U.S. Appl. No. 11/291,294.

Final Office Action mailed Mar. 10, 2011 in U.S. Appl. No. 12/510,182.

Amendment After Final Office Action mailed Jul. 11, 2011 in U.S. Appl. No. 12/510,182.

Response A filed Aug. 13, 2010 to Office Action mailed Mar. 18, 2010 in U.S. Appl. No. 12/510,187.

Office Action mailed Nov. 28, 2011 in U.S. Appl. No. 11/291,294.

Office Action mailed Aug. 26, 2011 in U.S. Appl. No. 12/510,182 9pp.

Office Action mailed Feb. 28, 2012 in U.S. Appl. No. 12/510,188 19pp.

Office Action mailed Feb. 6, 2012 in U.S. Appl. No. 12/510,190 19pp.

Final office action mailed Aug. 20, 2012 in U.S. Appl. No. 12/582,453 8pp.

Office Action mailed Feb. 28, 2012 in U.S. Appl. No. 12/582,453 24pp.

Office Action mailed Aug. 24, 2012 in U.S. Appl. No. 12/510,190 8pp.

Office action mailed Jul. 3, 2012 in U.S. Appl. No. 12/510,185 14pp.

Final office action mailed Jul. 30, 2012 in U.S. Appl. No. 11/291,294 8pp.

Amendment after final office action filed Apr. 11, 2011 in U.S. Appl. No. 11/291,294 7pp.

Response mailed Aug. 19, 2011 in U.S. Appl. No. 11/291,294 8pp.

Response filed Mar. 19, 2012 in U.S. Appl. No. 11/291,294 10pp.

Office Action mailed Dec. 22, 2011 in U.S. Appl. No. 12/510,182 11pp.

Response filed Mar. 19, 2012 in U.S. Appl. No. 12/510,182 10pp.

Office Action mailed Jul. 24, 2012 in U.S. Appl. No. 12/510,182 9pp.

Response to Office Action filed May 29, 2012 in U.S. Appl. No. 12/510,188 12pp.

Final Office Action mailed Oct. 4, 2012 in U.S. Appl. No. 12/510,188 17pp.

Response to Office Action filed May 7, 2012 in U.S. Appl. No. 12/510,190 14pp.

Response to Office Action filed May 29, 2012 in U.S. Appl. No. 12/582,453 12pp.

(56) References Cited

OTHER PUBLICATIONS

Letter of Express Abandonment filed Oct. 16, 2012 in U.S. Appl. No. 12/582,453, 1p.
Response G mailed Oct. 10, 2012, responding to Jul. 12, 2012 Office Action, in U.S. Appl. No. 11/291,294 10 pp.
Dec. 28, 2012 Examiner Amendment in U.S. Appl. No. 11/291,294 3 pp.
Nov. 23, 2011 Notice of Allowance in U.S. Appl. No. 11/291,294 4 pp.
Nov. 1, 2011 Response D to Office Action mailed Jul. 24, 2012 in U.S. Appl. No. 12/510,182 13 pp.
Dec. 31, 2012 Final Office Action in U.S. Appl. No. 12/510,182 16 pp.
Oct. 3, 2012 Response A in U.S. Appl. No. 12/510,185 12 pp.
Jan. 15, 2013 Office Action in U.S. Appl. No. 12/510,185 7 pp.
Nov. 28, 2012 Notice of Allowance in U.S. Appl. No. 12/510,187 9 pp.
Jan. 13, 2013 Response B in U.S. Appl. No. 12/510,188 15 pp.
Jan. 18, 2013 Advisory Action in U.S. Appl. No. 12/510,188 2 pp.
Sep. 6, 2012 Interview Summary in U.S. Appl. No. 12/510,190 2 pp.
Nov. 2, 2012 Response B filed in U.S. Appl. No. 12/510,190 15 pp.
Jan. 28, 2012 Office Action in U.S. Appl. No. 12/510,190 14 pp.
Oct. 22, 2012 Notice of Abandonment in U.S. Appl. No. 12/582,453 2 pp.
RCE filed Apr. 4, 2013 in U.S. Appl. No. 12/510,188 20 pp.
Mar. 28, 2013 Response to Final OA in U.S. Appl. No. 12/510,182 5 pp.
U.S. Appl. No. 13/850,133, filed Mar. 25, 2013, "Analysis of Stress Impact on Transistor Performance," 29 pp.
U.S. Appl. No. 12/510,182, filed Jul. 27, 2009 "Analysis of Stress Impact on Transistor Performance," 23 pp.
U.S. Appl. No. 12/510,185, filed Jul. 27, 2009 "Analysis of Stress Impact on Transistor Performance," 22 pp.
U.S. Appl. No. 12/510,188, filed Jul. 27, 2009 "Analysis of Stress Impact on Transistor Performance," 23 pp.
U.S. Appl. No. 12/510,190, filed Jul. 27, 2009 "Analysis of Stress Impact on Transistor Performance," 26 pp.
Thompson et al., "A 90-nm Logic Technology Featuring Strained-Silicon," IEEE Transactions on Electron Devices, vol. 51, No. 11, Nov. 2004, pp. 1790-1797.
U.S. Appl. No. 12/510,185—Final Office Action dated Jun. 12, 2013, pp. 1-8.
Response to Final Office Action and RCE filed Dec. 15, 2010 in U.S. Appl. No. 12/510,187, pp. 1-13.
U.S. Appl. No. 12/510,182—Notice of Allowance dated Jun. 13, 2013, 45 pages, pp. 1-45.
U.S. Appl. No. 12/510,188—Office Action dated Jun. 26, 2013, pp. 1-15.
U.S. Appl. No. 12/510,190—Notice of Allowance dated Aug. 27, 2013, 25 pages, pp. 1-25.
U.S. Appl. No. 13/850,963—Office Action dated Jul. 8, 2013, pp. 1-29.

* cited by examiner

ANALYSIS OF STRESS IMPACT ON TRANSISTOR PERFORMANCE

RELATED APPLICATIONS

This application is a continuation of U.S. application Ser. No. 12/510,187, filed 27 Jul. 2009, which is a division of U.S. application Ser. No. 11/291,294, filed 1 Dec. 2005 (now U.S. Pat. No. 8,407,634, issued 26 Mar. 2013), both of which are incorporated herein in their entirety.

FIELD OF THE INVENTION

The invention relates to the modeling of integrated circuit devices, and more particularly to the modeling of stress impact on transistor performance.

BACKGROUND AND SUMMARY OF THE INVENTION

It has long been known that semiconductor materials such as silicon and germanium exhibit the piezoelectric effect (mechanical stress-induced changes in electrical resistance). See for example C. S. Smith, "Piezoresistance effect in germanium and silicon", Phys. Rev., vol. 94, pp. 42-49 (1954), incorporated by reference herein. The piezoelectric effect has formed the basis for certain kinds of pressure sensors and strain gauges, but only recently has it received attention in the manufacture of integrated circuits. In integrated circuit fabrication, one of the major sources of mechanical stress is the differential expansion and contraction of the different materials used. For example, typical fabrication technologies involve electrically isolating the active regions of groups of one or more transistor by surrounding them with shallow trench isolation (STI) regions which are etched into the silicon and then filled with an insulator, such as an oxide. During cooling, oxides tend to shrink less than the surrounding silicon, and therefore develop a state of compressive stress laterally on the silicon regions of the device. Of significance is the stress exerted by the STI regions on the silicon forming a Metal-Oxide-Semiconductor Field-Effect Transistor (MOSFET) channel, because the piezoelectric impact of such stress can affect carrier mobility, and therefore current flow through the channel (Ion). In general, the higher the electron mobility in the channel, the faster the transistor switching speed.

The stress exerted on a region of silicon decays rapidly as a function of distance from the stress-causing interfaces. In the past, therefore, while process technologies could not produce today's extremely narrow channel widths, the stress-induced impact on performance could be ignored because only the edges of the diffusion region (adjacent to the STI regions) were affected. The channel regions were too far away from the STI regions to exhibit any significant effect. As process technologies have continued to shrink, however, the piezoelectric effect on transistor performance is no longer negligible.

Technology Computer Aided Design (TCAD) models are frequently used to model the behavior of integrated circuit devices at the level of individual transistors. Behaviors characterized at this level can be fed back to improve the circuit layout or the fabrication process, or they can be used to derive circuit level parameters (e.g. SPICE parameters) of the device for subsequent analysis of the circuit at macroscopic levels. TCAD analysis has long been able to take stress effects into account, but only by performing 3-dimensional finite element analysis of a single transistor or a small fragment of the chip. The computation time required to obtain accurate results, however, limited the utility of this kind of analysis to only small regions of a chip layout that include only several transistors. For example, it has not been practical to perform a TCAD analysis to obtain reasonably accurate circuit level parameters for layout regions larger than about a dozen transistors, or about 2-3 diffusion regions. Even then, huge amounts of CPU time, up to several hours per transistor, were required to obtain reasonably accurate results. The required computation time makes this approach prohibitively expensive for any large fragments of the chip layout.

Recently, a simplified model was developed for approximating stress effects on electron and hole mobilities. See R. A. Bianchi et al., "Accurate Modeling of Trench Isolation Induced Mechanical Stress Effects on MOSFET Electrical Performance," IEEE IEDM Tech. Digest, pp. 117-120 (December 2002), and U.S. Patent Publication No. 2002/0173588 (2003), both incorporated herein by reference. A variation of this model, with some additional fitting terms and parameters, was incorporated into Revision 4.3.0 of the Berkeley B SIM standard model. See Xuemei (Jane) Xi, et al., "BSIM4.3.0 Model, Enhancements and Improvements Relative to BSIM4.2.1", University of California at Berkeley (2003), available at http:(slash)(slash)www-device.eecs.berkeley.edu/~bsim3/BSIM4/BSIM430/doc/BSIM430_Enhancement.pdf, incorporated by reference herein. The model is known as the Length of Diffusion (LOD) model, since its primary parameter is the length of the diffusion region on each side of the channel of a transistor under study. Roughly, the model analyzes the layout to find the LOD at different segments along the width of the channel, calculates a weighted average LOD for the entire channel width, calculates a stress based on the weighted average LOD, and then converts that stress value to a change in mobility.

There are a number of problems with the LOD model. First, the model is limited to STI-induced stress. It therefore ignores many other potential sources of stress. For example, some integrated circuit manufacturers form SiGe in the source and drain areas of a p-channel transistor intentionally to induce certain stresses on the channel; this source of stress is not taken into account in the LOD model, nor are stresses induced by differential coefficients of expansion of superposing layers. Additionally, several semiconductor manufacturers use strained cap layers covering the transistors on top of the gate stacks. It is typical to use tensile nitride cap layers for n-channel transistors and compressive nitride cap layers for p-channel transistors. Some other potential stress sources include tensile STI that is beneficial for both n-channel and p-channel transistors and tensile Si:C (carbon-doped silicon) in the source/drain of the n-channel transistors. None of these stress sources are taken into account by the LOD methodology.

Second, the LOD model fails to take into account stresses that might be present transversely to the length of diffusion, across the channel width-wise. It has been discovered that compressive stress in this direction can affect carrier mobility in the channel in significant and surprising ways.

Third, more generally than the second deficiency, since the LOD model considers only hydrostatic pressure, which is a sum of all normal (i.e. volume changing rather than rotational) stress components, it fails to take into account differing vector stress components. Different stress components relative to the channel direction are known to affect carrier mobility differently.

Fourth, the LOD model fails to take into account the presence of other structures in the neighborhood of a region under study, apart from the nearest STI interface. Other structures beyond this interface might reduce the amount of oxide presumed to be exerting a force, and therefore might reduce the actual stress in the channel.

Accordingly, it would be extremely desirable to provide a stress analysis method that approximates the stresses in a region of an integrated circuit chip, more accurately than does the LOD model, and without incurring the computation costs of a 3-dimensional finite element analysis. Such a method can enable stress analysis of much larger regions of the circuit, including of an entire integrated circuit chip.

BRIEF DESCRIPTION OF THE DRAWINGS

The invention will be described with respect to specific embodiments thereof, and reference will be made to the drawings, in which.

DETAILED DESCRIPTION

Figure 1:
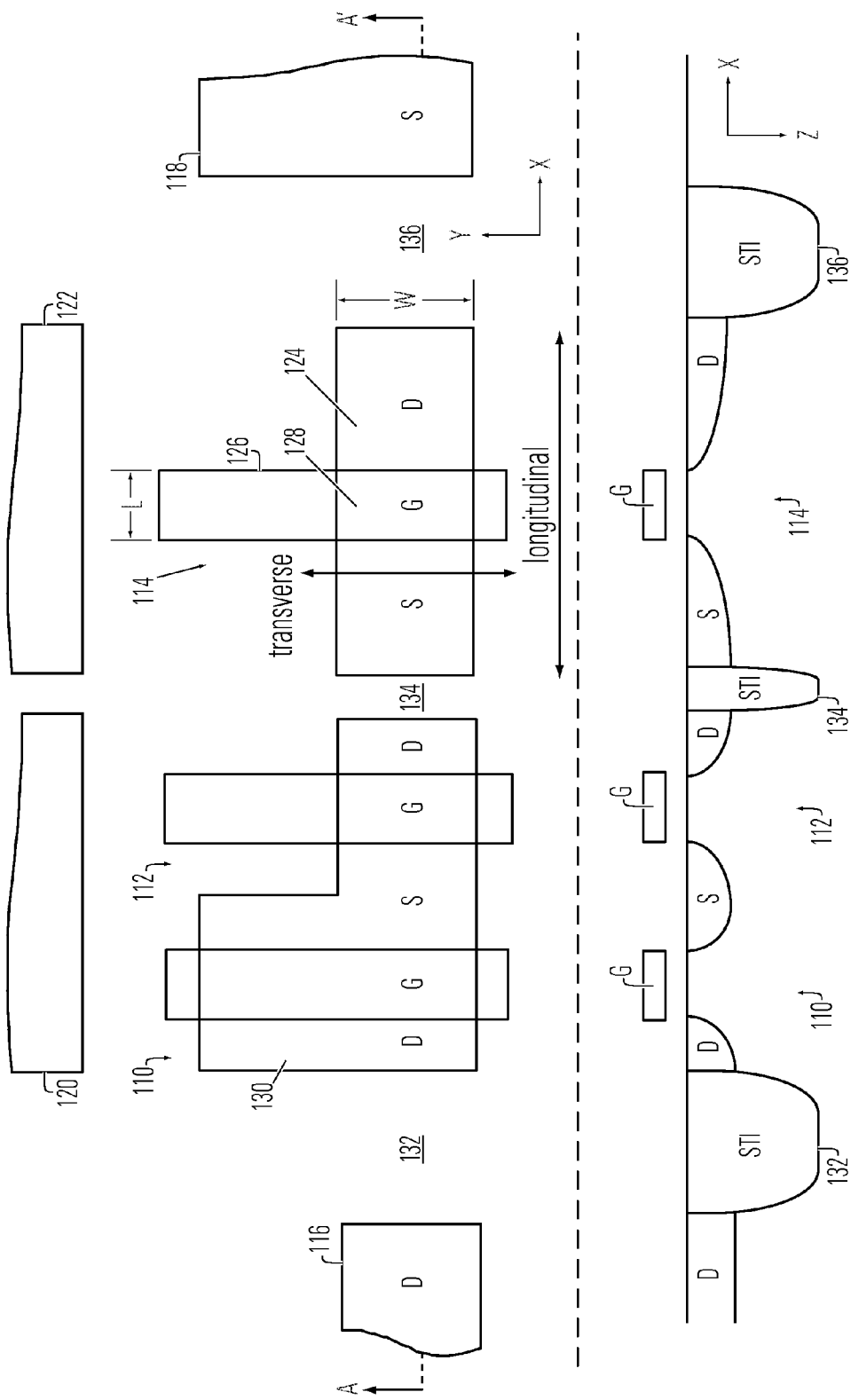
FIG. 1 shows an illustrative layout region with three transistors. The top portion of the diagram illustrates a plan view of the layout region, and the bottom portion of the diagram illustrates a cross-section taken at sight-line A-A'.

In order to best describe an embodiment of the invention, reference will be made to an illustrative layout portion as shown in FIG. 1. In FIG. 1, the top portion of the diagram illustrates a plan view of the layout region, and the bottom portion of the diagram illustrates a cross-section taken at sight-line A-A' as shown in the top portion. The layout region of FIG. 1 includes three transistors 110, 112 and 114, plus some other structures 116, 118, 120 and 122. Referring to transistor 114 as an example, it comprises a diffusion region 124 which is crossed by a gate conductor 126. The portion of the diffusion region 124 to the left of the gate 126 is the source diffusion region of the transistor, and the portion to the right of the gate 126 is the drain diffusion region. The portion of the diffusion region 124 overlapping with below the gate 126 is the channel 128 of the transistor. As used herein, the term "region" represents a two-dimensional area in a plan view of the layout. Stress "in" a region is considered to be the stress close to the surface of the region, where current flows. In the embodiments described herein, an approximation is made that the stress "in" a region is equal to the stress "at" the surface of the region. In another embodiment, stresses within a volume of the chip can be taken into account as well, including at depths below the surface.

The description herein will also be assisted if the following definitions are established. As shown in FIG. 1, as used herein, the "longitudinal" direction of a transistor is the direction of current flow from source to drain when the transistor is turned on. The "transverse" direction is perpendicular to the longitudinal direction, and perpendicular to the direction of current flow. Both the longitudinal and transverse directions of the transistor are considered to be "lateral" directions, meaning a direction that is parallel to the surface. Other "lateral" directions include those (not shown) which are parallel to the surface but intersect both the transverse and longitudinal directions at angles. The "vertical" direction is normal to the surface of the channel and therefore perpendicular to all possible lateral directions. The "length" of a structure in the layout is its length in the longitudinal direction, and its "width" is its width in the transverse direction. It can be seen from the layout of transistor 114 that the length of its channel 128 is a significantly shorter than its width, which is typical for the transistors that are used in logic circuits. Also shown in FIG. 1 are the X, Y, and Z coordinate axes. In the layout of FIG. 1, the X direction is the same as the longitudinal direction, the Y direction is the same as the transverse direction, and the Z direction is perpendicular to both the longitudinal and transverse directions, representing a depth into the integrated circuit chip.

In the layout of FIG. 1, transistors 110 and 112 share a common diffusion region 130. In addition, all regions in the plan view of FIG. 1 outside the diffusion regions 116, 130, 124, 118, 120 or 122, are STI regions containing oxide. Three of the STI regions can be seen in the cross-sectional view, specifically region 132, disposed between diffusion regions 116 and 130; region 134, disposed between diffusion regions 130 and 124; and region 136, disposed between diffusion regions 124 and 118. All these STI regions exert compressive stress on the diffusion regions, including within the transistor channels. In the prior art LOD model, only the stresses exerted in the longitudinal direction are taken into account. The methods described herein, on the other hand, can take into account stresses in the transverse and vertical directions as well.

The methods described herein can also take into account stress mitigating features, whereas the LOD method cannot. For example, the STI region 134 exerts a particular stress longitudinally toward the channels of transistors 112 and 110, and that stress is maximum at the interface between the STI region 134 and the diffusion region 130 and decays by a predetermined function of distance toward the channels. The LOD method assumes that the STI region to the right of the interface has a particular typical length in that direction, and therefore assumes a particular maximum stress value at the interface. But another diffusion region 124 is present in the layout of FIG. 1, only a short distance to the right of that interface. Thus the length of the STI region may actually be very short, which would reduce the actual stress on the two channel regions. Some of the methods described herein avoid this inaccuracy by taking into account stress mitigating features, such as the presence of diffusion region 124.

The methods described herein can also take into account the stresses caused by other stress generation mechanisms aside from STI/silicon interfaces. For example, in an embodiment in which the source and drain regions of the p-channel transistors are formed of silicon-germanium alloy, but the channel regions are not, stresses are exerted on the channel regions due to the crystal lattice mismatch at their interface with the silicon-germanium alloy regions. These stresses, too, can be taken into account by methods described herein. As used herein, a "stress generation mechanism" is one that arises at an interface between a pair of different materials. Typically the stress arises due to either thermal mismatch or crystal lattice mismatch or built-in stress obtained as a consequence of specific deposition chemistry. Two stress generation mechanisms are themselves considered herein to be "different" if they differ in at least one material of the pair. Two stress generation mechanisms are themselves considered herein to be different also if they arise from different physical principles, even where the material pairs are the same.

Figure 2:
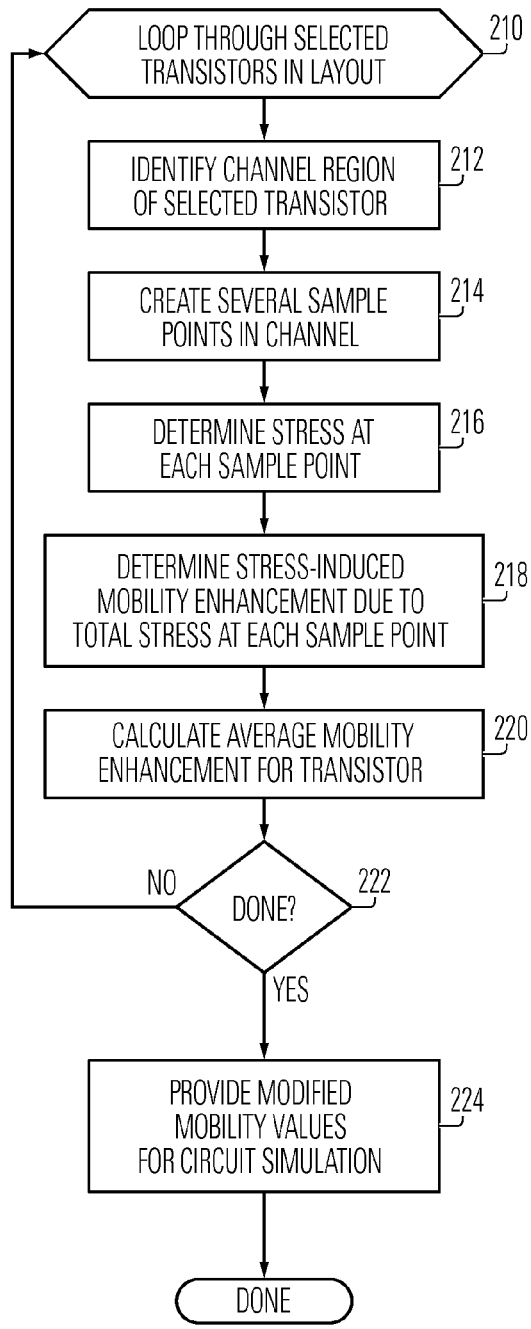
FIGS. 2, 4 and 5 are flowcharts for an embodiment of methods of the invention.

FIG. 2 is an overall flowchart of an embodiment of the invention. As with all flowcharts herein, it will be appreciated that many of the steps can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied.

Referring to FIG. 2, in a step 210, the system first starts a loop through selected transistors in a layout. Because of the speed and accuracy with which mobility enhancement values can be determined using features of the present invention, it is feasible to determine modified carrier mobilities for all transistors on the integrated circuit chip. Alternatively, a user may select only certain important transistors, such as those along one of the critical paths. Embodiments of the invention enable reasonably accurate analysis of layout regions collectively containing more than 12 or so transistors, or more than 3 diffusion regions, both of which were impractical or impossible with conventional methods. For purposes of illustration, it will be assumed that the first transistor selected in step 210 is transistor 112 (FIG. 1).

In step 212, the system identifies the channel region of the selected transistor. The channel region can be identified by the intersection of the gate and diffusion layout layers.

Figure 3:
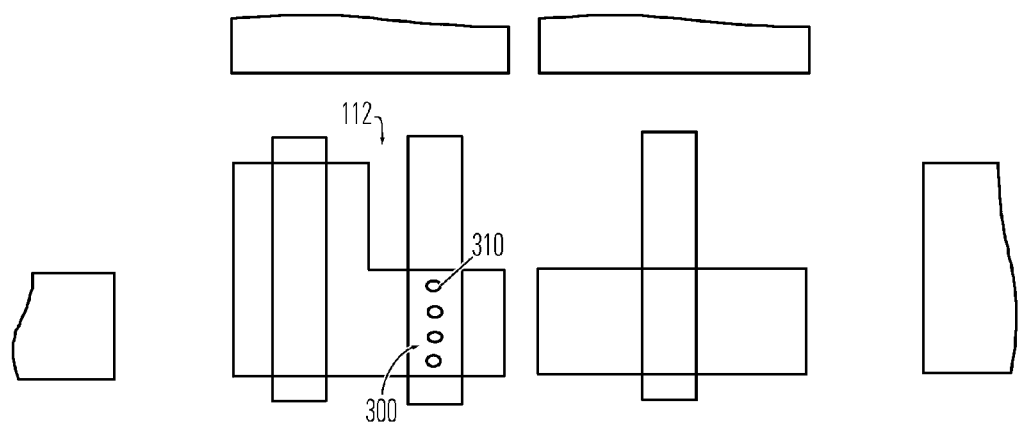
FIG. 3 shows the plan view of the layout of FIG. 1, with four sample points identified.

In step 214, several sample points are selected in the channel. FIG. 3 shows the plan view of the layout of FIG. 1, with four sample points 310 identified in the channel region 300 of the transistor 112. In FIG. 1 the sample points lie on a line oriented transversely across the channel, and in the middle of the channel longitudinally, and the sample points are spaced uniformly along that line within the channel. In general, the effort is to estimate the stress distribution throughout the channel. Since the channel is typically very short in the longitudinal direction, it is usually sufficient to choose sample points all in a single laterally-oriented line disposed in the center of the channel longitudinally. But since the channel is typically very wide laterally, relatively speaking, several sample points across the channel laterally are usually required to develop an accurate estimate of the stress distribution throughout the channel. The designer will choose a number of sample points across the channel that represents an acceptable compromise between accuracy, which improves with more sample points, and speed of analysis, which improves with fewer sample points.

Figure 4:
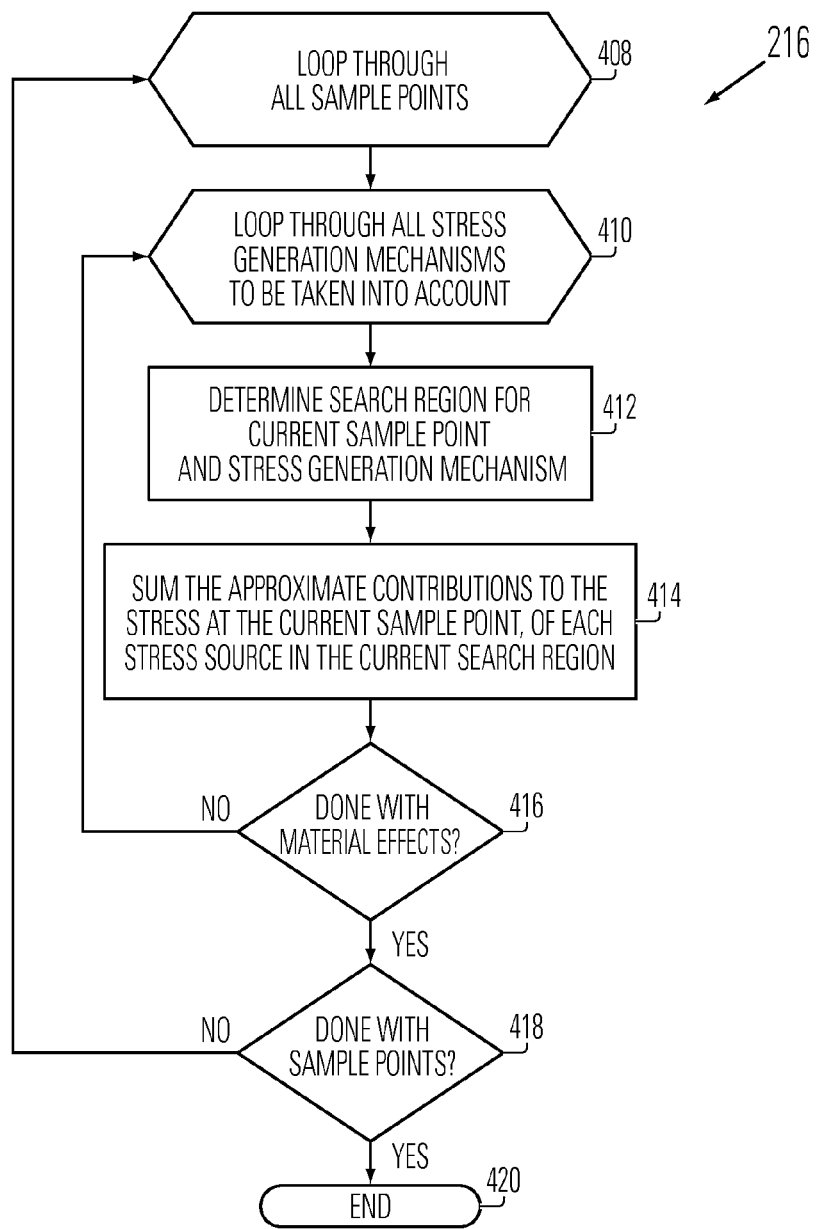

In step 216 the stress at each of the sample points 310 is approximated. (As used herein, the term "approximation" includes exactness as a special case. Therefore it is possible that in some instances the approximations developed in step 216 will be exact.) FIG. 4 is a flowchart detail of step 216. In step 408, the routine begins by looping through all the sample points. In step 410, if there is more than one stress generation mechanism to be taken into account, the system begins a loop through all of the stress generation mechanisms to be taken into account. For example, STI-induced stresses can be taken into account, as well as silicon-germanium-induced stresses. Other stresses can also be taken into account, such as those induced by a silicide layer that is grown on top of the source and drain areas and those induced by the strained cap layers that cover the gate stacks.

In step 412, a search region is determined for the current sample point and stress generation mechanism. The search region should be large enough to include layout features outside the diffusion region containing the sample point, but since stress decays with distance, it should not extend to such a great distance that the stress contribution at the sample point is negligible. In one embodiment, a rectangular region can be chosen. In another embodiment, a circular region with a predefined radius can be chosen. Typically, the greater the depth into the wafer at which the current stress generation mechanism contributes to the stress at the surface of the wafer, the larger the search region should be. As an example, for STI-induced stress, the search radius might be approximately 2 microns and encompass (with current technology) 16-20 transistors. The search radius for silicon-germanium-induced stress would typically be smaller, since the silicon-germanium source/drain regions are typically much shallower than STI.

In step 414, the system combines the approximate stress contributions to the stress at the current sample point, due to the current stress generation mechanism, of each stress source in the current search region. As used herein, the "combining" of values means evaluating the values together in a predetermined mathematical function. In the present embodiment, an assumption is made that the stress contributions from all sources and all stress generation mechanisms are additive, and so in step 414, the system simply sums the approximate stress contributions.

In one embodiment, the combining of approximate stress contributions can involve dividing the search region into a rectangular grid and calculating the stress caused by each grid rectangle in which there is a source of stress. In a preferred embodiment, however, these stress contributions are approximated using an edge walking technique such as that illustrated in the flow chart of FIG. 5.

Figure 5:
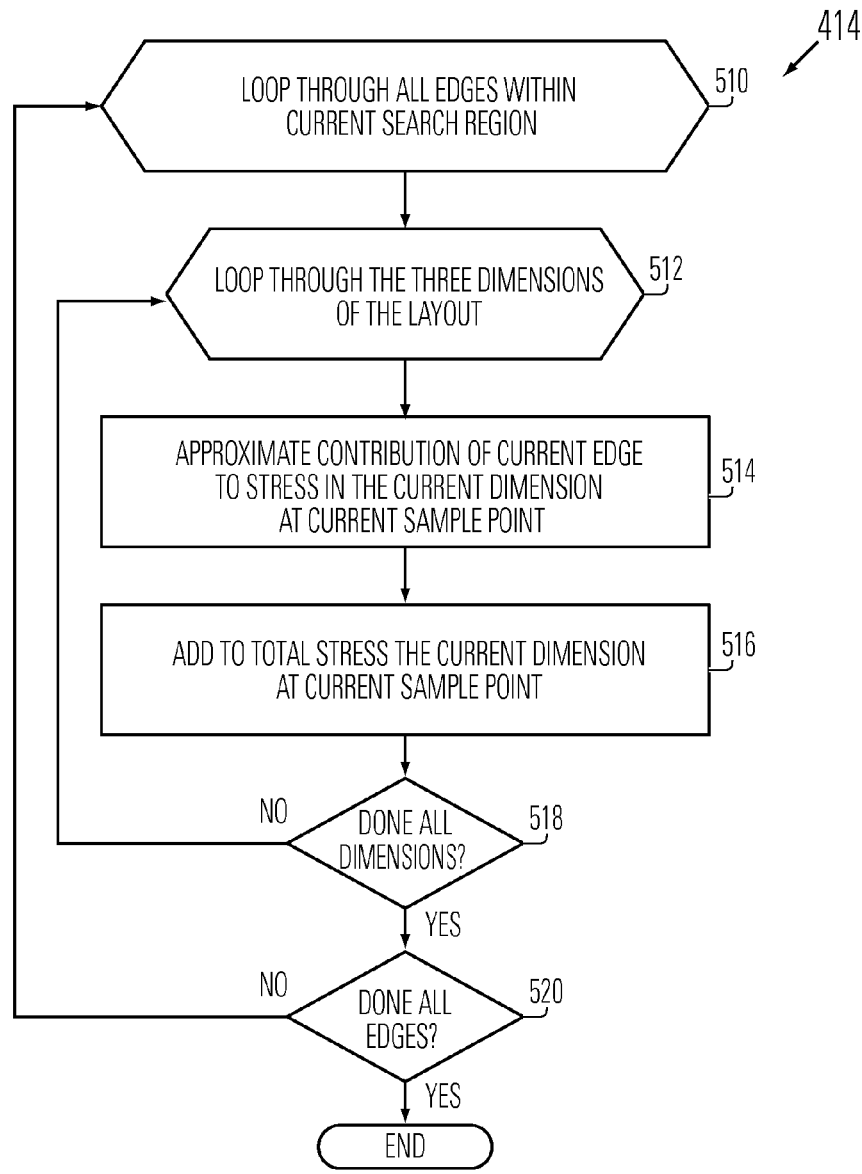

In the method of FIG. 5, the contribution of each edge in the current search region to the stress at the current sample point due to the current stress generation mechanism, is approximated. In a preferred embodiment, this approximation takes into account stress components in the X and Y directions independently. The edges that are walked are those shown in the plan view of FIG. 1, which all lie in either the X direction or the Y direction. The edges that are parallel to the X axis will introduce stress along both lateral directions X and Y. Similarly, the edges that are parallel to the Y axis will introduce stress along both lateral directions X and Y. The stress introduced in X direction by an edge that is parallel to the Y axis is identical to the stress introduced in Y direction by an edge that is parallel to the X axis for the same stress generation mechanism. This stress component is sometimes referred to herein as a normal stress component. The stress introduced in X direction by an edge that is parallel to the X axis is, in turn, identical to the stress introduced in Y direction by an edge that is parallel to the Y axis for the same stress generation mechanism. This stress component is sometimes referred to herein as a tangential stress component.

In one embodiment, the layout is restricted to edges that are aligned with the X and Y Cartesian axes in the layout plane. In another embodiment, the edges of the layout features can have arbitrary shapes, usually described as polygons with edges that are oriented arbitrarily in the X-Y layout plane. This can be important whenever there are significant optical proximity effects that distort the original rectangular layout.

The depth of the edges into the wafer is taken into account in the present embodiment not by calculating a stress component in the Z direction, but by appropriate calibration of the stress peak at the edges and the function by which the stress decays with distance. This calibration is discussed below. Stress components in the Z direction due to edges buried below the surface and not visible in the plan view of FIG. 1, can also be taken into account independently, but these are given only cursory treatment in the present discussion. The reader will understand how to extend the methods to include stress contributions in the Z direction more fully. Several stress sources are known to generate a significant vertical stress component, notably a strained cap layer deposited over the gate stack. It is known that p-channel transistors are insensitive to the vertical stress component, whereas n-channel transistors are very sensitive to the vertical stress component. Calculation of the vertical stress component can be performed in a similar way to the lateral stress components, with the vertical stress decaying as a function of distance from transistor to the edges of the strained cap layers that are located in the XY layout plane.

Referring to FIG. 5, the method begins an outer loop to consider all the feature edges that appear within the current search region (step 510). The particular edges considered within the loop 510 will depend on the current stress generation mechanism being considered. For example, if the current stress generation mechanism is STI-induced stress, then only the interfaces between STI regions and diffusion regions are considered in the loop 414. If the current stress generation mechanism is silicon-germanium-induced stress, then the following two types of interfaces are taken into account in the loop 414: the interfaces between the silicon-germanium diffusion regions and the silicon channel regions, and the interfaces between the silicon-germanium diffusion regions and the STI. If the current stress generation mechanism under consideration is the strained cap layer, then the edges of the polysilicon gates and the edges of the strained cap layers are taken into account. In many cases the edges are shifted from their original location in the layout by applying an offset that either expands or shrinks the entire polygon. For example, the edges of the polysilicon gates need to be offset by expanding each polygon in that layout layer to account for the sidewall spacers that surround each polysilicon gate. The stress contribution (positive or negative) caused by each edge considered within the loop of step 512 will be taken into account in the determination of the total stress at the current sample point.

In step 512, another loop is begun, nested within the loop of step 510, through the three dimensions of the layout. The third dimension (Z) may be omitted in some embodiments. All the edges shown in FIG. 1 will introduce stress in all three directions.

Figure 6:
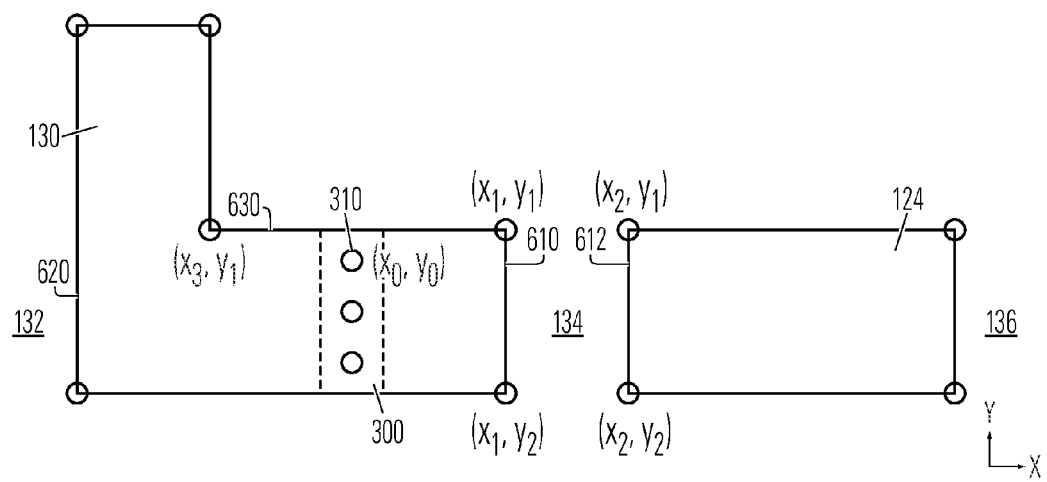
FIG. 6 illustrates diffusion regions in a portion of the plan view of the layout of FIG. 1.

In step 514, the system approximates the contribution of the current edge to the stress in the current direction at the current sample point. Reference is made to FIG. 6 in order to better explain this step. FIG. 6 illustrates diffusion regions in a portion of the plan view of the layout of FIG. 1. For STI-induced stress, the significant edges are those bounding the diffusion regions. Edge 610 of diffusion region 130 in FIG. 6 is the STI-boundary nearest sample point 310 toward the right, and continuing toward the right, edge 612 represents the end of the STI region 134 in the rightward direction. Similarly, edge 630 of diffusion region 130 in FIG. 6 is the STI-boundary nearest sample point 310 toward the top of the drawing. Edge 610 is oriented in the Y direction and has endpoints at $(x_1, y_1)$ and $(x_1, y_2)$. Edge 612 is also oriented in the Y direction and has endpoints at $(x_2, y_1)$ and $(x_2, y_2)$. Edge 630 is oriented in the X direction and has endpoints at $(x_3, y_1)$ and $(x_1, y_1)$. The position of sample point 310 is referred to as $(x_0, y_0)$.

Consider first the normal stress introduced in the X direction by the STI edges oriented in the Y direction. Initially, the stress at sample point 310 due to a nearby edge 610 is considered. The stress contribution in the X direction can be approximated by a materials-dependent factor $\sigma_0$, times the decay function of the distance in the X direction between the current edge and the current sample point, times a decay function of the length in the Y direction of the edge. More specifically, the stress contribution $\sigma_{xx}$ can be approximated by:

$$\sigma_{xx}(x,y) = \text{sign} * \sigma_0 * \sigma_{xx}(x) * \sigma_{xx}(y), \quad (1)$$

where $$\sigma_{xx}(x) = \lambda_x(x_0 - x_1) \quad (2)$$

and $$\sigma_{xx}(y) = \lambda_y(y_0 - y_2) - \lambda_y(y_0 - y_1) \quad (3)$$

and $\lambda_x(r)$ and $\lambda_y(r)$ are decay functions describing the reduction of the stress contribution as a function of distance in the X and Y directions of the layout, respectively.

In eq. (1), the value of "sign" is +1 or −1, whichever is required such that near edges of an STI region (such as edge 610 in FIG. 6) produce a positive stress contribution $\sigma_{xx}$ and far edges of an STI region (such as edge 612 in FIG. 6 produce a negative stress contribution $\sigma_{xx}$; because near edges of an STI region contribute additional stress whereas far edges mitigate the stress contribution. It will be appreciated that neither edge 612 nor the edge to the left of STI region 132 would have been taken into account in the prior art LOD method. Neither would the additional Y-oriented edges disposed further to the right or left of these, or X-oriented edges such as edge 630 in FIG. 6.

The factor $\sigma_0$ is a function of the current stress generation mechanism. It can be calculated using a detailed TCAD finite element stress analysis for example, or it can be extracted from electrical measurements of a specifically designed test structure. Once determined, $\sigma_0$ remains constant over the entire chip for a given manufacturing technology. Whenever the manufacturing process flow is modified, the stress distribution might be affected and therefore $\sigma_0$ has to be re-calibrated.

The decay function $\lambda_i(r)$ can be different for different embodiments, and for different dimensions of the layout. Because of the difficulty of deriving the true decay function from physical principles, most embodiments will only approximate it. Roughly, the function chosen should be strong but finite in the near field, asymptotically reducing to zero in the far field, and in the midfield it should behave somewhere between the appropriate behavior for two extreme cases of approximations of the actual geometry of the stress source: if the stress source represented by a layout edge were a line source on the surface of the chip, then the proper decay would have the form $1/r^2$; whereas if the stress source represented by a layout edge were a plane source extending vertically into the chip, the plane containing the layout edge, then the proper decay would have the form $1/r$. In fact the stress source represented by a layout edge is somewhere between those two extremes, which motivates a decay function of the form $1/r^\beta$, $1 < \beta < 2$. In a preferred embodiment the following decay function is used for each i'th dimension:

$$\lambda_i(r) = 1/(\alpha_i * r^{\beta_i} + \epsilon_i). \quad (4)$$

In eq. (4), $\beta_i$ depends roughly on the depth into the chip of the stress source material, and can be on the order of 1.2 for both the X and Y stress component directions. The factor $\alpha_i$ is determined by mechanical properties of silicon. The additive factor $\epsilon_i$ is small, much less than $\alpha_i * r^{\beta_i}$. It is included in part to avoid the degenerate result of infinite stress at r=0, and in part because it can improve the accuracy of the midfield behavior of the function. The values of $\alpha_i$, $\beta_i$ and $\epsilon_i$ each of which may be different for the different stress contribution directions X and Y, may be estimated using a full TCAD simulation or calibrated using electrical measurements of the test structures.

Other types of decay function approximations can be used in other embodiments. Another function type that might be used is the error function, erfc(r). In some embodiments, the decay function $\lambda_i(r)$ might not be strictly monotonic, especially in the very near field where the stress might increase slightly before beginning a monotonic decay.

For the normal stress component in the Y direction, similar equations can be used. In the present embodiment, the stress contribution in the Y direction due to edge 630, having endpoints (x3, y1) and (x1, y1) is approximated by:

$$\sigma_{yy}(x,y) = \text{sign} * \sigma_0 * \sigma_{yy}(x) * \sigma_{yy}(y), \quad (5)$$

where $$\sigma_{yy}(x) = \lambda_x(x_0 - x_3) - \lambda_x(x_0 - x_1) \quad (6)$$

$$\sigma_{yy}(y) = \lambda_y(y_0 - y_1) \quad (7)$$

and $\lambda_i(r)$ is as given in eq. (4).

Similarly, for the Z direction, again similar equations can be used.

Note that whereas the layout diagrams of FIGS. 1, 3 and 6 all illustrate structures whose edges are in either the X or Y directions of the layout, it will be appreciated that the above formulas and the routine of FIG. 5 can be easily adapted for structures having edges that are oriented arbitrarily in the X-Y layout plane.

After the stress contribution due to the current edge in the current direction is approximated from eq. (1), it is added to a total stress value in the current direction at the current sample point (step 516). The routine then loops back to evaluating the stress contribution of the current edge in the next layout dimension (step 518). If there are no more dimensions to consider, then in step 520, the routine loops back to begin considering the next diffusion-STI interface edge within the search region.

Returning to FIG. 4, in step 416, after the approximate contributions to the stress at the current sample point of all stress generation mechanisms in the current search region have been added up, the routine loops back to step 410 to consider the stress contributions due to the next stress generation mechanism. If there are no further stress generation mechanisms to consider, then in step 418, the routine loops back to step 408 to approximate the stress at the next sample point. If there are no more sample points to consider, then in step 420 the routine terminates with an approximation of the total stress at each sample point.

Returning now to FIG. 2, after the total stress has been approximated at each sample point, the routine approximates the stress-induced mobility enhancement due to such total stress at each sample point (step 218). This conversion from stress to mobility enhancement is well known, and can be in the form:

$$\Delta\mu = f_x(\sigma_{xx}) + f_y(\sigma_{yy}) + f_z(\sigma_{zz}). \quad (8)$$

To a first order approximation, where the silicon wafer on which the layout will be fabricated has (100) surface orientation and the transistor channels are aligned with the <110> crystalline direction, the following functions can be used:

$$f_x(\sigma_{xx}) = a * \sigma_{xx},$$

$$f_y(\sigma_{yy}) = b * \sigma_{yy}, \text{ and}$$

$$f_z(\sigma_{zz}) = c * \sigma_{zz}$$

where a=0.3, b=−0.5 and c=0.2 for electron mobility, and where a=−0.7, b=0 and c=0.7 for hole mobility. Different functions would be used for different crystalline orientations of the wafer and the channel.

In step 220, the mobility enhancements approximated for the several sample points in the channel are averaged, to approximate the average mobility enhancement for the entire channel in current transistor. The actual mobility in the channel of the current transistor can then be approximated as $$\mu = \mu 0 + \Delta\mu, \quad (9)$$

where µ0 is the mobility in the channel before stress effects are taken into account.

In step 222, if there are more transistors to be analyzed, the routine returns to step 210 to determine the average mobility enhancement for the next transistor. If not, then in step 224, modified mobility values for the analyzed transistors can now be provided for circuit simulation or other purposes.

As used herein, a given value is "responsive" to a predecessor value if the predecessor value influenced the given value. If there is an intervening processing element or step, the given value can still be "responsive" to the predecessor value. If the intervening processing element or step combines more than one value, the value output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas the description above focuses on modeling stresses and converting stresses into stress-induced mobility enhancements, stress also affects several other transistor properties. It is known to affect the band gap structure and as a result of the modified band gap structure it shifts the threshold voltage of the transistor under stress. Stress that is applied early in the process flow can also affect the dopant diffusion, activation, and segregation in the transistor channel and source/drain and result in modified doping profiles in the channel and source/drain. These other stress-induced modifications of transistor properties are typically much weaker than the stress-induced mobility enhancements, but nevertheless can be noticeable. The approaches described herein can be used for estimating such second-order effects in a similar way they are used to model stress-induced mobility enhancements.

The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for developing an integrated circuit device in which mobility in a channel of a first transistor of the circuit will be modified by stress effects, the first transistor being disposed in a first diffusion region in a layout of the integrated circuit and there being a second diffusion region disposed outside and spaced from the first diffusion region in the integrated circuit layout, the method comprising:

developing an approximation of stress-induced mobility variation in the channel of the first transistor, the approximation developed in dependence upon both a stress contribution arising due to a first materials interface at an edge of the first diffusion region, and a stress contribution arising due to a second materials interface at an edge of the second diffusion region; and providing the approximation for simulating the circuit.

2. The method of claim 1, wherein the stress contribution arising due to the first materials interface enhances the total stress in the channel of the first transistor, and wherein the stress contribution arising due to the second materials interface mitigates the total stress in the channel of the first transistor.

3. The method of claim 2, wherein the approximation of the stress-induced mobility variation in the channel of the first transistor is developed in dependence further upon a stress enhancing contribution arising due to a third materials interface at an edge of the second diffusion region.

4. The method of claim 1, wherein mobility in a channel of a second transistor of the circuit will also be modified by stress effects, the second transistor being disposed in a diffusion region in the integrated circuit layout, further comprising providing for simulating the circuit, an approximation of stress-induced mobility variation in the channel of the second transistor developed in dependence upon both a stress contribution arising due to a third materials interface at an edge of the diffusion region having the second transistor, and a stress contribution arising due to a fourth materials interface outside the diffusion region having the second transistor, wherein the stress contribution due to the fourth materials interface is different from the stress contribution due to the second materials interface.

5. The method of claim 4, wherein the first and second transistors are disposed in the same diffusion region in the layout.

6. The method of claim 1, further comprising fabricating the integrated circuit device in dependence upon the approximation.

7. The method of claim 1, wherein the approximation is developed in dependence upon stress contributions arising due to a plurality of materials interfaces within a predetermined region of influence of the layout.

8. The method of claim 1, wherein providing an approximation comprises:

searching a predetermined search region of the layout for feature edges; and developing the approximation in dependence upon stress contributions arising due to materials interfaces at a plurality of feature edges found in the search.

9. A method for developing an integrated circuit device in which mobility in a transistor channel in a first diffusion region in a layout of the integrated circuit will be modified by stress effects, the method comprising:

providing for simulating the circuit, an approximation of stress-induced mobility variation in the channel, the approximation developed in dependence upon both a stress contribution arising due to a first materials interface at an edge of the first diffusion region, and a stress contribution arising due to a second materials interface outside the first diffusion region, wherein the integrated circuit layout further includes a second diffusion region disposed outside and spaced from the first diffusion region, the second materials interface being at an edge of the second diffusion region, and wherein the approximation is developed in dependence further upon a stress enhancing contribution arising due to a third materials interface at an edge of the second diffusion region.

10. The method of claim 9, wherein the stress contribution arising due to the first materials interface enhances the total stress in the channel, and wherein the stress contribution arising due to the second materials interface mitigates the total stress in the channel.

11. The method of claim 9, further comprising fabricating the integrated circuit device in dependence upon the approximation.

12. A method for developing an integrated circuit device in which at least one property in a set of transistor properties of a transistor of the circuit will be modified by effects of stress in a transistor channel in a first diffusion region in a layout of the integrated circuit, the method comprising:

providing for simulating the circuit, an approximation of the stress-induced variation of each property in the set developed in dependence upon both a stress contribution arising due to a first materials interface at an edge of the first diffusion region, and a stress contribution arising due to a second materials interface outside the first diffusion region, wherein the set of transistor properties for which stress-induced variation is approximated, includes transistor threshold voltage.

13. The method of claim 12, wherein the set of transistor properties for which stress-induced variation is approximated, further includes mobility variation.

14. The method of claim 12, further comprising fabricating the integrated circuit device in dependence upon the approximation.

15. A system configured to perform the steps of claim 1.

16. The system of claim 15, wherein the stress contribution arising due to the first materials interface enhances the total stress in the channel of the first transistor, and wherein the stress contribution arising due to the second materials interface mitigates the total stress in the channel of the first transistor.

17. The system of claim 16, wherein the system is configured to develop the approximation of the stress-induced mobility variation in the channel of the first transistor, in dependence further upon a stress enhancing contribution arising due to a third materials interface at an edge of the second diffusion region.

18. The system of claim 15, wherein mobility in a channel of a second transistor of the circuit will also be modified by stress effects, the second transistor being disposed in a diffusion region in the integrated circuit layout, wherein the system is configured further to provide for simulating the circuit, an approximation of stress-induced mobility variation in the channel of the second transistor developed in dependence upon both a stress contribution arising due to a third materials interface at an edge of the diffusion region having the second transistor, and a stress contribution arising due to a fourth materials interface outside the diffusion region having the second transistor, wherein the stress contribution due to the fourth materials interface is different from the stress contribution due to the second materials interface.

19. The system of claim 18, wherein the first and second transistors are disposed in the same diffusion region in the layout.

20. The system of claim 15, wherein the system is configured to develop the approximation in dependence upon stress contributions arising due to a plurality of materials interfaces within a predetermined region of influence of the layout.

21. The system of claim 15, wherein in developing the approximation the system is configured to:

search a predetermined search region of the layout for feature edges; and develop the approximation in dependence upon stress contributions arising due to materials interfaces at a plurality of feature edges found in the search.

\* \* \* \* \*